(12) United States Patent
Kim et al.

(10) Patent No.: US 6,392,149 B1
(45) Date of Patent: May 21, 2002

(54) APPARATUS AND METHOD FOR ROUTING CABLES

(75) Inventors: David J. Kim; William W. Ruckman, both of San Jose; Steven J. Furuta, Santa Clara, all of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/951,993

(22) Filed: Sep. 13, 2001

(51) Int. Cl.$^7$ .................................................. G05K 7/02
(52) U.S. Cl. ....................... 174/72 A; 361/825; 361/826; 248/68.1; 248/49; 312/223.1; 312/223.2; 174/72 A; 174/92; 174/70 R; 174/71 R
(58) Field of Search .................................. 361/734, 725, 361/727, 789, 825, 826; 174/72 A, 92, 70 R, 71 R; 248/68.1, 49, 282.1; 312/223.1, 223.2, 223.6

(56) References Cited

U.S. PATENT DOCUMENTS

| | | | |
|---|---|---|---|
| 4,353,518 A | * 10/1982 | Taylor et al. | 248/60 |
| 5,399,812 A | * 3/1995 | Woszczyna et al. | 174/97 |
| 5,688,135 A | * 11/1997 | Gallagher, Sr. | 439/214 |
| 5,893,539 A | * 4/1999 | Tran et al. | 248/68.1 |
| 5,921,402 A | * 7/1999 | Magenheimer | 211/26 |
| 6,019,323 A | * 2/2000 | Jette | 248/49 |
| 6,070,742 A | * 6/2000 | McAnally et al. | 211/26 |
| 6,315,249 B1 | * 1/2001 | Jensen et al. | 248/65 |
| 6,305,556 B1 | * 10/2001 | Mayer | 211/26 |

* cited by examiner

*Primary Examiner*—Lynn D. Feild
*Assistant Examiner*—David Foster
(74) *Attorney, Agent, or Firm*—Williams, Morgan & Amerson, P.C.

(57) ABSTRACT

A cable arm for a computer system includes a first leg, a second leg hingedly joined to the first leg, and an enclosure flange hingedly joined to the second leg. The cable arm further includes a rack flange, hingedly joined to the first leg, capable of being attached to a rack for holding the computer system, an enclosure bracket capable of being attached to the computer system and capable of being attached to the enclosure flange, and a hook, extending from the second leg, capable retaining a cable attached to the computer system.

34 Claims, 3 Drawing Sheets

APPARATUS AND METHOD FOR ROUTING CABLES

BACKGROUND OF THE INVENTION

1. Field of the Invention

This invention relates to a method and apparatus for routing cables extending from a computer system.

2. Description of the Related Art

Computer systems are general-purpose devices that may be modified to perform particular tasks or functions. Generally, computer systems include a motherboard, a power source, and other components mounted within an enclosure. The motherboard typically includes a number of connectors or slots in which special purpose printed circuit boards or "cards", e.g., peripheral component interface (PCI) bus cards, industry standard architecture (ISA) bus cards, proprietary bus cards, and the like, may be inserted. These special-purpose cards may be used to add to or enhance the functionality of the computer system. For example, a conventional computer system may have its graphics capability enhanced by the addition of a graphics card. Similarly, the sound-producing capability of the computer system may be enhanced by the addition of a sound card.

Such cards may require electrical cables to interconnect the cards with other components. For example, the graphics card may be interconnected with a monitor by an electrical cable, or the sound card may be interconnected with one or more speakers by one or more electrical cables. Further, the power source may be interconnected to a current supply via an electrical cable. Generally, such an electrical cable is coupled with the card, the power supply, or the like through an opening in a rear panel of the computer system enclosure. The cable is then routed to the other component being coupled. It is common for the computer system to have four or more cables extending therefrom to other components, and for multiple computer systems, each having multiple cables extending therefrom, to be mounted in a single rack.

Arranging the cables extending from the computer system in a neat and orderly fashion has traditionally been a problem. Traditional rack-mounted computer systems often incorporate bars or trays mounted in a fixed relationship to the rack. In many conventional installations, the computer system is inserted into the rack, the cables are coupled with various connections through the rear panel of the computer system, the bar or tray is attached to the rack using screws or the like, and the cables are fastened to the bar or routed through the tray. The limited space available between the rear panel of the computer system and the bar or tray presents problems in attaching the cables to the bar or in routing the cables through the tray. Often, the tray may have a cover that is removably attached thereto to retain the cables in the tray and installation of the cover is also often difficult in the space between the rear panel of the computer system and the tray.

Further, if changes are required to the cables to the computer system, the cables are typically removed from the bar or, if a tray is used, the cover may be removed from the tray. The screws or the like holding the bar or tray to the rack may be removed and the bar or tray may then be removed from the rack prior to making the cabling changes. Thus, such conventional systems may be difficult to use when cabling changes are needed.

SUMMARY OF THE INVENTION

In one aspect of the present invention, a cable arm for a computer system is presented. The cable arm includes a first leg, a second leg hingedly joined to the first leg, and an enclosure flange hingedly joined to the second leg. The cable arm further includes a rack flange, hingedly joined to the first leg, capable of being attached to a rack for holding the computer system, an enclosure bracket capable of being attached to the computer system and capable of being attached to the enclosure flange, and a hook, extending from the second leg, capable retaining a cable attached to the computer system.

In another aspect of the present invention, a computer assembly is provided. The computer assembly includes a computer system having an enclosure capable of housing components of the computer system and a cable arm. The cable arm includes a first leg, a second leg hingedly joined to the first leg, and an enclosure flange hingedly joined to the second leg. The cable arm further includes a rack flange, hingedly joined to the first leg, capable of being attached to a rack for holding the computer system, an enclosure bracket capable of being attached to the computer system and capable of being attached to the enclosure flange, and a hook, extending from the second leg, capable of retaining a cable attached to the computer system.

In yet another aspect of the present invention, a method of installing a computer system with an articulating cable arm in a rack is presented. The method includes attaching a first portion of the articulating cable arm to the rack, sliding the computer system partially into the rack, attaching a second portion of the articulating cable arm to an enclosure of the computer system, and connecting a cable to the computer system. The method also includes routing the cable around a hook extending from the articulating cable arm and sliding the computer system fully into the rack.

In a further aspect of the present invention, a method of removing a computer system having an articulating cable arm attached thereto from a rack is presented. The method includes sliding the computer system partially out of the rack, disconnecting a cable connected to the computer system, detaching the articulating cable arm from an enclosure of the computer system, and removing the computer system from the rack.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
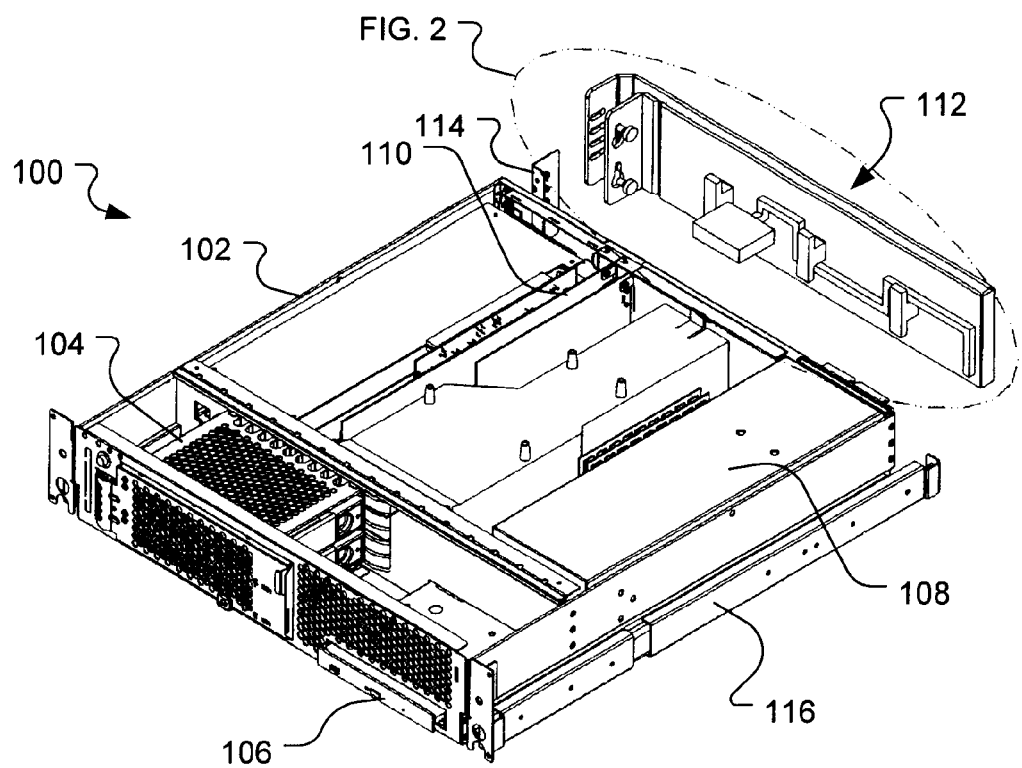
FIG. 1 is a partially exploded perspective view of a computer system according to the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

A computer system 100 according to the present invention is illustrated in FIG. 1. The computer system 100 includes an enclosure 102 housing one or more components, e.g., a motherboard (not shown), a hard disk drive 104, a CD-ROM drive 106, a power supply 108, and an expansion card 110. The computer system 100 further includes a cable arm 112 and an enclosure bracket 114 for attaching the cable arm 112 to the enclosure 102.

Figure 2:
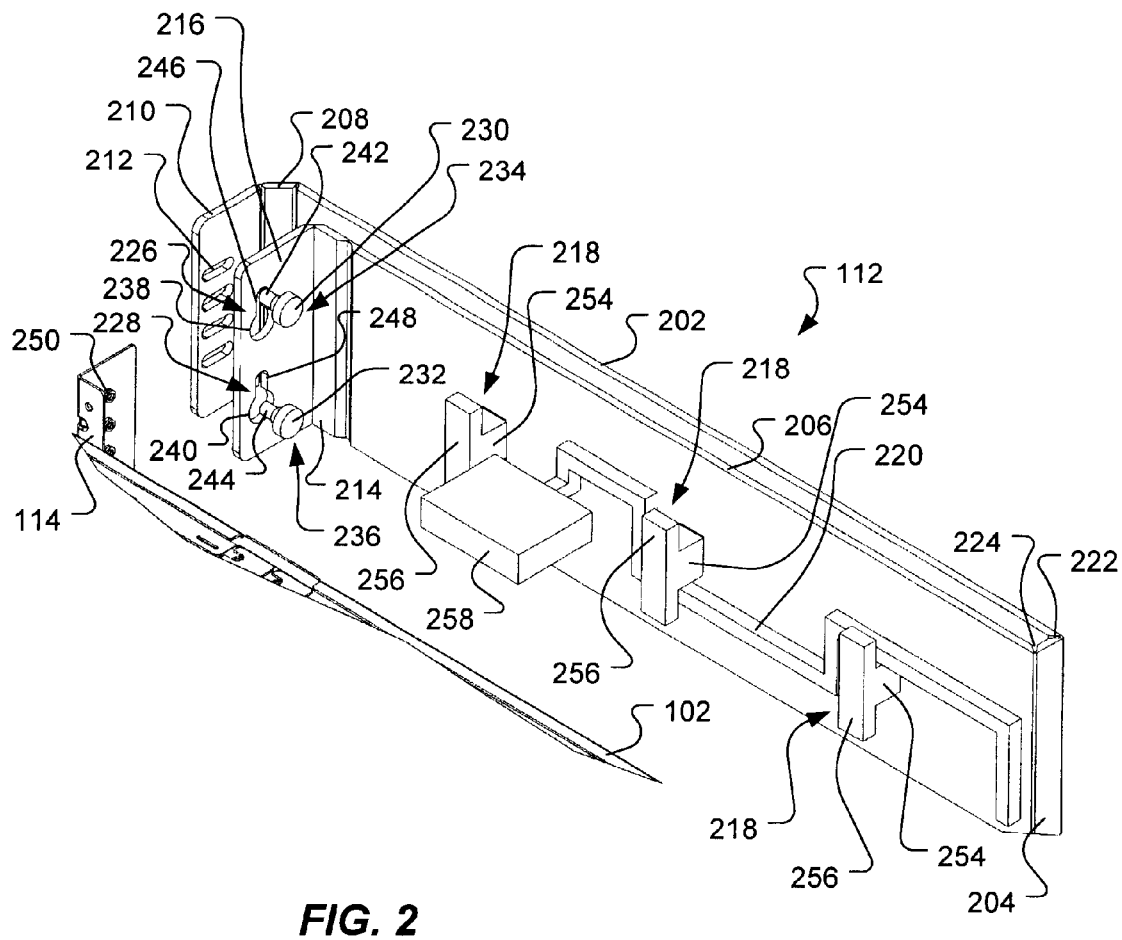
FIG. 2 is a partially exploded perspective view of a portion of the computer system of FIG. 1.

FIG. 2 illustrates a portion of the computer system 100 as indicated in FIG. 1. In the illustrated embodiment, the cable arm 112 includes a first leg 202 hingedly joined by a first hinge 204 to a second leg 206. The first leg 202 is also hingedly joined by a second hinge 208 to a rack flange 210. The rack flange 210 is attachable to a rack (not shown) capable of holding the computer system 100 by fasteners (not shown) inserted through openings 212 (only one indicated) in the rack flange 210. The second leg 206 is hingedly joined by a third hinge 214 to an enclosure flange 216. The second leg 206 also has a plurality of hooks 218 extending therefrom for retaining a cable 220. FIG. 2 illustrates a stylized cable 220, which can be any desired style of cable.

In the illustrated embodiment, the cable arm 112 comprises a unitary structure having molded-in hinges (i.e., the first hinge 204, the second hinge 208, and the third hinge 214). The present invention, however, encompasses the cable arm 112 having separate elements, e.g., having a separate first leg 202, a first hinge 204, a separate second leg 206, or the like. For example, the first leg 202 and the second leg 204 may be made of any desired material (e.g., a metal, a polymer, or the like) and may be hingedly joined by any desired type of hinge (e.g., a "piano" hinge or the like). Thus, any of the elements described above as being hingedly joined may be joined by any desired type of hinge. Further, any hinge described above (e.g., the first hinge 204, the second hinge 208, or the third hinge 214) may have one or more than one pivot joint. In the illustrated embodiment, each of the first hinge 204, the second hinge 208, and the third hinge 214 have two pivot joints (e.g., pivot joints 222, 224 of the first hinge 204).

The enclosure flange 216 illustrated in FIGS. 1 and 2 includes two keyhole-shaped openings 226, 228 therethrough. The keyhole-shaped openings 226, 228 are sized such that heads 230, 232 of pins 234, 236 may pass through larger portions 238, 240 of the keyhole-shaped openings 226, 228 and such that shanks 242, 244 of the pins 234, 236 fit within smaller portions 246, 248 of the keyhole-shaped openings 226, 228. In the illustrated embodiment, the pins 234, 236 are threadedly engagable with studs 250 (only one indicated) extending from the enclosure bracket 114. Thus, when the pins 234, 236 are threadedly engaged with the studs 250, the enclosure flange 216 may be engaged with the pins 234, 236 when the shanks 242, 244 are disposed in the smaller portions 246, 248 of the keyhole-shaped openings 226, 228. Accordingly, if the enclosure flange 216 is moved with respect to the pins 234, 236 such that the heads 230, 232 can pass through the larger portions 238, 240 of the keyhole-shaped openings 226, 228, the enclosure flange 216 can be moved between a position wherein the enclosure flange 216 is engaged with the pins 234, 236 and a position wherein the enclosure flange 216 is disengaged with the pins 234, 236. Thus, the enclosure flange 216 may be engaged with or disengaged with the enclosure bracket 114 without the use of tools.

Alternatively, the shanks 242, 244 of the pins 234, 236 may have threaded portions (not shown) and the enclosure bracket 114 may have openings (not shown) therein for receiving the threaded portions of the pins 234, 236. The openings in the enclosure bracket may be threaded so that the threaded portions of the pins 234, 236 may be threadedly engaged with the openings in the enclosure bracket 114. However, threads may be omitted from the openings in the enclosure bracket 114 and nuts (not shown) may be used to hold the pins adjacent the enclosure bracket 114.

Figure 3:
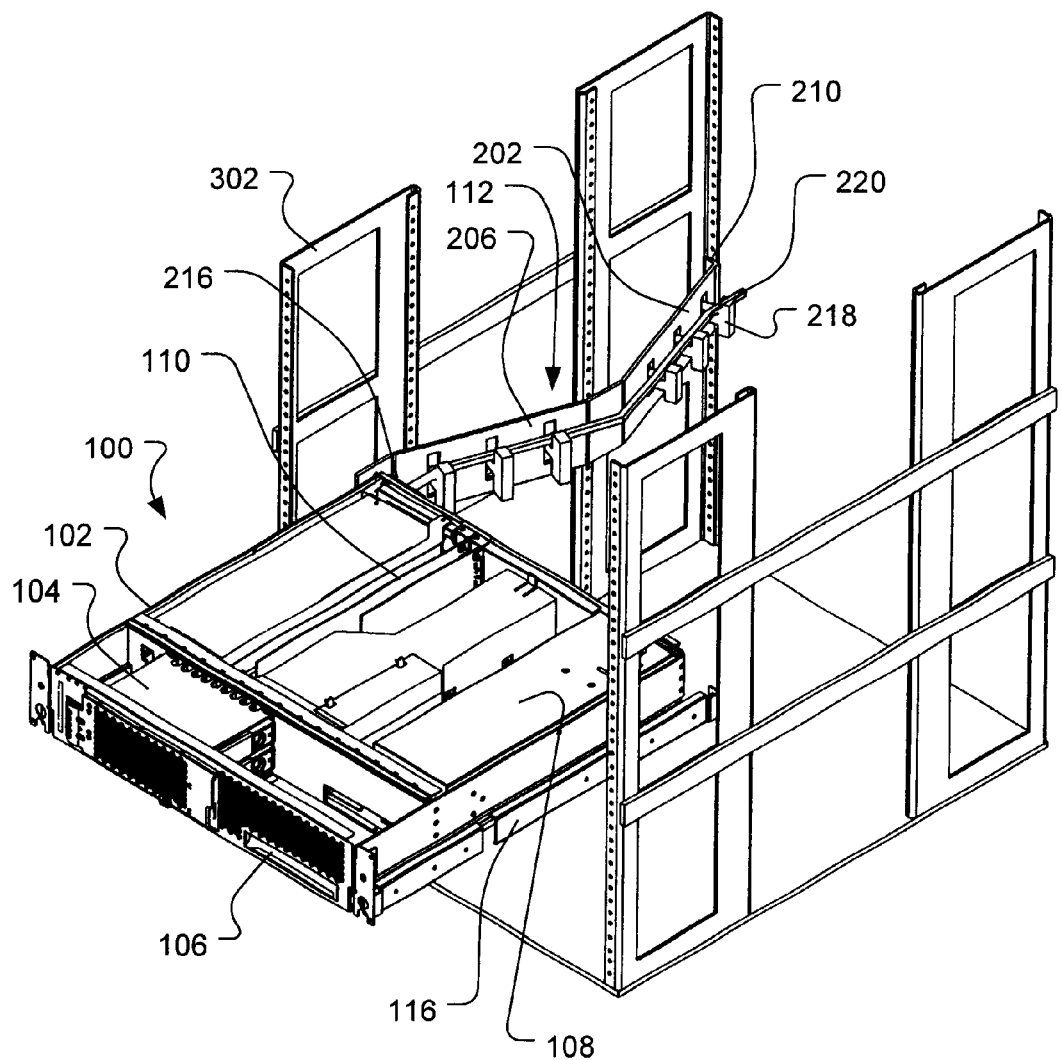
FIG. 3 is a perspective view of the computer system of FIG. 1.

The hooks 218 are provided to retain the cable 220 by routing the cable 220 around one or more posts 254 of the hooks 218, as illustrated in FIGS. 1 and 2. Top portions 256 of the hooks 218 inhibit the cable 220 from slipping off the posts 254. Thus, when the cable arm 112 is configured as described above and the connector 258 of the cable 220 is attached to a component (not shown) of the computer system 100, the cable arm 112 is capable of moving in response to the computer system 100 being extended from the rack along slides 116 (only one shown). As the computer system 100 is extended from the rack 302, the second leg 206 moves relative to the first leg 202, the first leg 202 moves relative to the rack flange 210, and the second leg 206 moves relative to the enclosure flange 216, as shown in FIG. 3. Thus, the connector 258 may be left connected to the computer system 100 as the computer system 100 is extended from the rack.

Should a need exist to remove the computer system 100 from the rack, the connector 258 (and any other connectors) may be disconnected from the computer system 100 and the enclosure flange 216 may be disconnected from the enclosure bracket 114 by moving the enclosure flange 216 with respect to the pins 234, 236 such that the heads 230, 232 pass through the larger portions 238, 240 of the keyhole-shaped openings 226, 228. The computer system 100 may then be removed from the rack. Thus, the cable arm 112 articulates by pivoting about the hinges 204, 208, and 214 in response to the computer system 100 being extended from the rack.

Conversely, the computer system 100 may be installed into the rack by sliding the computer system 100 partially into the rack, connecting the connector 258 (and any other connectors) to the computer system 100, routing the cable 220 around one or more of the hooks 218, and connecting the enclosure flange 216 to the enclosure bracket 114. The enclosure flange 216 may be connected to the enclosure bracket 114 by moving the enclosure flange 216 with respect to the pins 234, 236 such that the heads 230, 232 pass through the larger portions 238, 240 of the keyhole-shaped openings 226, 228 so that the shanks 242, 244 are disposed in the smaller portions 246, 248 of the keyhole-shaped openings 226, 228. At this point, the computer system 100 and cable arm 112 are configured as shown in FIG. 3. The computer system 100 may then be fully retracted into the rack. Thus, the cable arm 112 articulates by pivoting about the hinges 204, 208, and 214 in response to the computer system 100 being retracted into the rack.

The particular embodiments disclosed above are illustrative only, as the invention may be modified and practiced in different but equivalent manners apparent to those skilled in the art having the benefit of the teachings herein.

Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A cable arm for a computer system, comprising:
   a first leg;
   a second leg hingedly joined to the first leg;
   an enclosure flange hingedly joined to the second leg;
   a rack flange, hingedly joined to the first leg, capable of being attached to a rack for holding the computer system;
   an enclosure bracket capable of being attached to the computer system and capable of being attached to the enclosure flange; and
   a hook, extending from the second leg, capable of retaining a cable attached to the computer system.

2. A cable arm, according to claim 1, wherein the enclosure flange is capable of being removably attached to the enclosure bracket.

3. A cable arm, according to claim 1, further comprising a pin, extending from the enclosure bracket, having a head and a shank, wherein the enclosure flange defines an opening therethrough having a portion capable of allowing the head of the pin to pass therethrough and having a portion capable of preventing the head of the pin to pass therethrough to engage the enclosure bracket with the pin.

4. A cable arm, according to claim 3, wherein the opening defined by the enclosure flange comprises a keyhole-shaped opening.

5. A cable arm, according to claim 1, wherein the enclosure flange is capable of being attached to the enclosure bracket without the use of tools.

6. A cable arm, according to claim 1, further comprising a first hinge, joined to the first leg and the second leg, capable of hingedly joining the first leg and the second leg.

7. A cable arm, according to claim 6, wherein the first hinge further comprises a plurality of pivot joints.

8. A cable arm, according to claim 1, further comprising a second hinge, joined to the second leg and the enclosure flange, capable of hingedly joining the second leg and the enclosure flange.

9. A cable arm, according to claim 6, wherein the second hinge further comprises a plurality of pivot joints.

10. A cable arm, according to claim 1, further comprising a third hinge, joined to the first leg and the rack flange, capable of hingedly joining the first leg and the rack flange.

11. A cable arm, according to claim 6, wherein the first hinge further comprises a plurality of pivot joints.

12. A cable arm, according to claim 1, wherein the hook further comprises a post for routing the cable therearound and a top portion for retaining the cable adjacent the post.

13. A computer assembly, comprising:
    a computer system having an enclosure capable of housing components of the computer system; and
    a cable arm comprising:
       a first leg;
       a second leg hingedly joined to the first leg;
       an enclosure flange hingedly joined to the second leg;
       a rack flange, hingedly joined to the first leg, capable of being attached to a rack for holding the computer system;
       an enclosure bracket capable of being attached to the computer system and capable of being attached to the enclosure flange; and
       a hook, extending from the second leg, capable of retaining a cable attached to the computer system.

14. A computer assembly, according to claim 1, wherein the enclosure flange is capable of being removably attached to the enclosure bracket.

15. A computer assembly, according to claim 1, further comprising a pin, extending from the enclosure bracket, having a head and a shank, wherein the enclosure flange defines an opening therethrough having a portion capable of allowing the head of the pin to pass therethrough and having a portion capable of preventing the head of the pin to pass therethrough to engage the enclosure bracket with the pin.

16. A computer assembly, according to claim 3, wherein the opening defined by the enclosure flange comprises a keyhole-shaped opening.

17. A computer assembly, according to claim 1, wherein the enclosure flange is capable of being attached to the enclosure bracket without the use of tools.

18. A computer assembly, according to claim 1, further comprising a first hinge, joined to the first leg and the second leg, capable of hingedly joining the first leg and the second leg.

19. A computer assembly, according to claim 6, wherein the first hinge further comprises a plurality of pivot joints.

20. A computer assembly, according to claim 1, further comprising a second hinge, joined to the second leg and the enclosure flange, capable of hingedly joining the second leg and the enclosure flange.

21. A computer assembly, according to claim 6, wherein the second hinge further comprises a plurality of pivot joints.

22. A computer assembly, according to claim 1, further comprising a third hinge, joined to the first leg and the rack flange, capable of hingedly joining the first leg and the rack flange.

23. A computer assembly, according to claim 6, wherein the first hinge further comprises a plurality of pivot joints.

24. A computer assembly, according to claim 1, wherein the hook further comprises a post for routing the cable therearound and a top portion for retaining the cable adjacent the post.

25. A method of installing a computer system with an articulating cable arm in a rack, comprising:
    attaching a first portion of the articulating cable arm to the rack;
    sliding the computer system partially into the rack;
    attaching a second portion of the articulating cable arm to an enclosure of the computer system;
    connecting a cable to the computer system;
    routing the cable around a hook extending from the articulating cable arm;
    sliding the computer system fully into the rack.

26. A method, according to claim 25, wherein attaching the second portion of the articulating cable arm to the enclosure of the computer system further comprises removably attaching the second portion of the articulating cable arm to the enclosure of the computer system.

27. A method, according to claim 25, wherein attaching the second portion of the articulating cable arm to the enclosure of the computer system further comprises attaching the second portion of the articulating cable arm to the enclosure of the computer system without the use of tools.

28. A method of removing a computer system having an articulating cable arm attached thereto from a rack, comprising:
    sliding the computer system partially out of the rack;
    disconnecting a cable connected to the computer system;

detaching the articulating cable arm from an enclosure of the computer system; and removing the computer system from the rack.

29. A method, according to claim 28, wherein detaching the articulating cable arm from the enclosure of the computer system further comprises detaching the articulating cable arm from the enclosure of the computer system without the use of tools.

30. An apparatus for installing a computer system with an articulating cable arm in a rack, comprising:

means for attaching a first portion of the articulating cable arm to the rack;

means for sliding the computer system partially into the rack;

means for attaching a second portion of the articulating cable arm to an enclosure of the computer system;

means for connecting a cable to the computer system via a connector;

means for routing the cable around a hook extending from the articulating cable arm;

means for sliding the computer system fully into the rack.

31. An apparatus, according to claim 30, wherein the means for attaching the second portion of the articulating cable arm to the enclosure of the computer system further comprises means for removably attaching the second portion of the articulating cable arm to the enclosure of the computer system.

32. A method, according to claim 30, wherein the means for attaching the second portion of the articulating cable arm to the enclosure of the computer system further comprises means for attaching the second portion of the articulating cable arm to the enclosure of the computer system without the use of tools.

33. An apparatus for removing a computer system having an articulating cable arm attached thereto from a rack, comprising:

means for sliding the computer system partially out of the rack;

means for disconnecting a cable connected to the computer system;

means for detaching the articulating cable arm from an enclosure of the computer system; and means for removing the computer system from the rack.

34. An apparatus, according to claim 33, wherein the means for detaching the articulating cable arm from the enclosure of the computer system further comprises means for detaching the articulating cable arm from the enclosure of the computer system without the use of tools.

* * * * *